United States Patent [19]
Hirose

[11] Patent Number: 5,409,846
[45] Date of Patent: Apr. 25, 1995

[54] METHOD OF FABRICATING A SEMICONDUCTOR DEVICE INCLUDING HETEROJUNCTION BIPOLAR TRANSISTOR

[75] Inventor: Takashi Hirose, Osaka, Japan

[73] Assignee: Matsushita Electric Industrial Co., Ltd., Osaka, Japan

[21] Appl. No.: 175,664

[22] Filed: Dec. 30, 1993

Related U.S. Application Data

[62] Division of Ser. No. 77,582, Jun. 17, 1993, abandoned.

[30] Foreign Application Priority Data

Jun. 24, 1992 [JP] Japan .................. 4-165846

[51] Int. Cl.6 ........................................ H01L 21/265
[52] U.S. Cl. ........................................ 437/31; 437/60; 437/133; 437/919
[58] Field of Search ............ 257/528, 532, 535, 577, 257/197; 437/60, 31, 133, 919, 51, 55, 195, 59, 126; 148/DIG. 14

[56] References Cited

U.S. PATENT DOCUMENTS 4,700,457 10/1987 Matsukawa .................. 148/DIG. 14
5,177,574 1/1993 Yoneda .................. 257/532

FOREIGN PATENT DOCUMENTS 2292853 12/1990 Japan .................. 257/532

OTHER PUBLICATIONS

Film Semiconductor Storage System, W. J. Taren IBM Technical Disclosure Bulletin, vol. 13 No. 1 (Jun. 1970).

Primary Examiner—Brian E. Hearn
Assistant Examiner—Tuan Nguyen
Attorney, Agent, or Firm—Lowe, Price, LeBlanc & Becker

[57] ABSTRACT

A semiconductor device or an integrated circuit includes a heterojunction bipolar transistor. The transistor includes an emitter region, a base region, and a transistor electrode. The emitter region is made of first material having a first forbidden band gap. The base region is made of second material having a second forbidden band gap. The first forbidden band gap is wider than the second forbidden band gap. The transistor electrode is made of third material. A capacitor includes a plurality of capacitor electrodes which contain a capacitor electrode made of the third material. The transistor and the capacitor are electrically connected.

7 Claims, 3 Drawing Sheets

5,409,846

METHOD OF FABRICATING A SEMICONDUCTOR DEVICE INCLUDING HETEROJUNCTION BIPOLAR TRANSISTOR

This application is a division of application Ser. No. 08/077,582 filed Jun. 17, 1993, now abandoned.

BACKGROUND OF THE INVENTION

This invention relates to a semiconductor device, such as an integrated circuit, which includes a heterojunction bipolar transistor and a capacitor. This invention also relates to a method of fabricating such a semiconductor device.

Heterojunction bipolar transistors (HBT's) are advantageous in high-speed operation. Some integrated circuits include a combination of an HBT and a capacitor. A small area occupied by the capacitor is desirable for compactness of the integrated circuit.

SUMMARY OF THE INVENTION

It is an object of this invention to provide a compact semiconductor device including a heterojunction bipolar transistor and a capacitor.

It is another object of this invention to provide a method of fabricating such a semiconductor device.

A first aspect of this invention provides a semiconductor device comprising a heterojunction bipolar transistor including an emitter region, a base region, and a transistor electrode, the emitter region being made of first material having a first forbidden band gap, the base region being made of second material having a second forbidden band gap, the first forbidden band gap being wider than the second forbidden band gap, the transistor electrode being made of third material; a capacitor including a plurality of capacitor electrodes which contain a capacitor electrode made of the third material; and means for electrically connecting the transistor and the capacitor.

A second aspect of this invention provides a semiconductor device comprising a heterojunction bipolar transistor including an emitter region, a base region, and a multi-layer structure, the emitter region being made of first material having a first forbidden band gap, the base region being made of second material having a second forbidden band gap, the first forbidden band gap being wider than the second forbidden band gap, the multi-layer structure including a plurality of layers which contain a layer made of third material; a capacitor including a plurality of capacitor electrodes which contain a capacitor electrode made of the third material; and means for electrically connecting the transistor and the capacitor.

A third aspect of this invention provides a method of fabricating a semiconductor device which comprises the steps of forming a multi-layer structure on a substrate, the multi-layer structure including a collector layer, a base layer, and an emitter layer, the emitter layer being made of material having a forbidden band gap wider than a forbidden band gap of material for the base layer; exposing an portion of the base layer; simultaneously forming a collector electrode or an emitter electrode and a first capacitor electrode, the collector electrode or the emitter electrode having an upper surface in a height position approximately equal to a height position of a surface of the exposed portion of the base layer; and forming wiring lines which include a second capacitor electrode opposed to the first capacitor electrode.

A fourth aspect of this invention provides a method of fabricating a semiconductor device which comprises the steps of forming a multi-layer structure on a substrate, the multi-layer structure including a collector layer, a base layer, an emitter layer, and a collector contact layer or an emitter contact layer, the emitter layer being made of material having a forbidden band gap wider than a forbidden band gap of material for the base layer; forming a first capacitor electrode from a portion of the collector contact layer or the emitter contact layer; and forming wiring lines which include a second capacitor electrode opposed to the first capacitor electrode.

A fifth aspect of this invention provides a semiconductor device comprising a heterojunction bipolar transistor including a region made of a material; a multi-layer capacitor of a laminated structure including three electrodes which contain an electrode made of a material same as the material for the region of the transistor; and means for electrically connecting the transistor and the capacitor.

A sixth aspect of this invention provides a method of fabricating a semiconductor device which comprises the steps of forming a heterojunction bipolar transistor including a region made of a material; forming a multi-layer capacitor of a laminated structure including three electrodes which contain a capacitor electrode made of a material same as the material for the region of the transistor; simultaneously forming the region of the transistor and the capacitor electrode; and electrically connecting the transistor and the capacitor.

DESCRIPTION OF THE PREFERRED EMBODIMENTS

Before detailed description of this invention, a background-art device will be described for a better understanding of this invention.

Figure 3A:
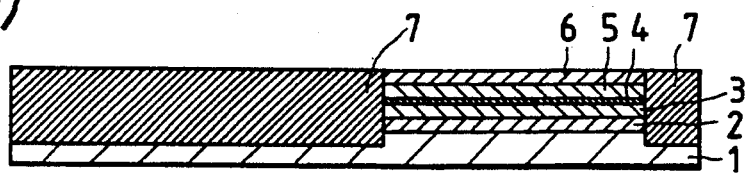
FIGS. 3(a) to 3(e) are sectional views of a semiconductor wafer in different states which occur during the fabrication of a background-art semiconductor device.
Figure 3B:
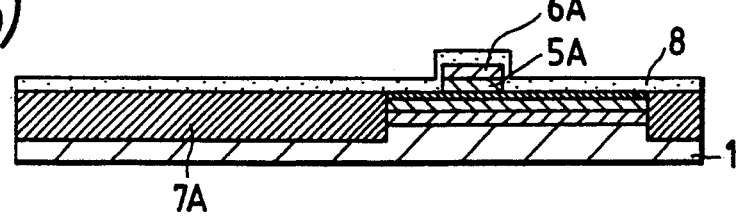
Figure 3C:
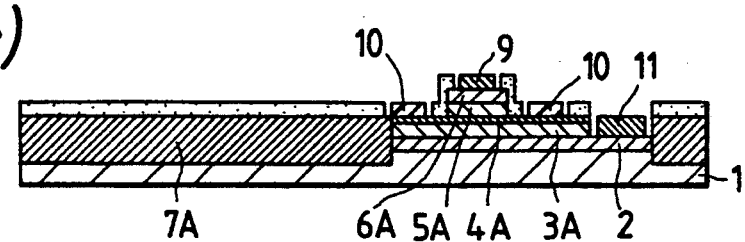
Figure 3D:
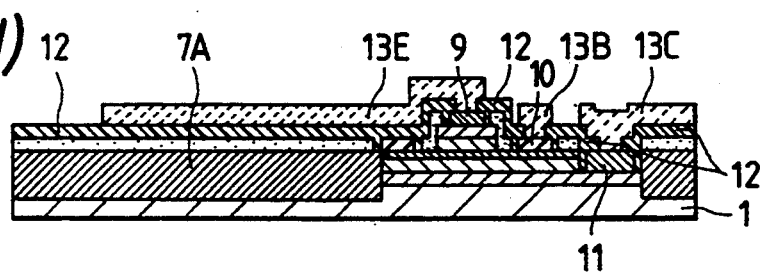
Figure 3E:
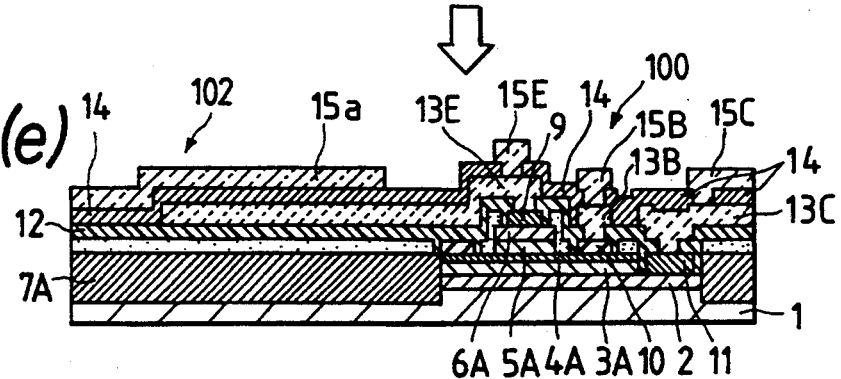

FIG. 3(e) shows a background-art semiconductor device or integrated circuit which includes a heterojunction bipolar transistor 100 and a capacitor 102. The transistor 100 is of the emitter-up type.

As shown in FIG. 3(e), the semiconductor device includes a substrate 1. A collector contact layer 2 is formed on a given area of the substrate 1. A collector region 3A and a base region 4A of the transistor 100 are sequentially formed on a given area of the collector contact layer 2. An emitter region 5A and an emitter cap region 6A of the transistor 100 are sequentially superposed on an intrinsic area of the base region 4A. The emitter region 5A is made of material which has a forbidden band gap (a forbidden band width) wider than that of the base region 4A.

A collector electrode 11 made of conductive material such as metal is formed on an area of the collector contact layer 2 which extends outside the collector region 3A. A single-layer metal wiring line 13C extends between the collector electrode 11 and a two-layer metal wiring line 15C. The collector region 3A is electrically connected to the two-layer metal wiring line 15C via the collector contact layer 2, the collector electrode 11, and the single-layer metal wiring line 13C.

A base electrode 10 is formed on an extrinsic area of the base region 4A. A single-layer metal wiring line 13B extends between the base electrode 10 and a two-layer metal wiring line 15B. The base region 4A is electrically connected to the two-layer metal wiring line 15B via the base electrode 10 and the single-layer metal wiring line 13B.

An emitter electrode 9 is formed on the emitter cap region 6A. A single-layer metal wiring line 13E extends between the emitter electrode 9 and a two-layer metal wiring line 15E. The emitter region 5A is electrically connected to the two-layer metal wiring line 15E via the emitter cap region 6A, the emitter electrode 9, and the single-layer metal wiring line 13E.

A high-resistivity region 7A is formed on an area of the substrate 1 which extends outward of the transistor 100. The high-resistivity region 7A isolates the transistor 100 from neighboring transistors and elements.

The capacitor 102 is formed on an area of the substrate 1 which extends outward of the transistor 100. The capacitor 102 is electrically connected to the emitter of the transistor 100. The capacitor 102 includes a pair of parallel opposed electrodes and an insulating film 14 extending therebetween. One of the electrodes of the capacitor 102 is formed by a two-layer metal wiring electrode 15a. The other of the electrodes of the capacitor 102 is formed by an extension of the single-layer wiring line 13E which leads from the emitter electrode 9 of the transistor 100.

The background-art semiconductor device was fabricated as follows. As shown in FIG. 3(a), a semi-insulating substrate or wafer 1 made of GaAs was prepared, and a multi-layer structure (a laminated structure) was formed on the substrate 1. The multi-layer structure had a collector contact layer 2, a collector layer 3, a base layer 4, an emitter layer 5, and an emitter cap layer 6. The collector contact layer 2 was made of n-type GaAs which had a high carrier concentration (density). The collector layer 3 was made of n-type GaAs. The base layer 4 was made of p-type GaAs which had a high carrier concentration (density). The emitter layer 5 was made of N-type $Al_{0.3}Ga_{0.7}As$. The emitter cap layer 6 was made of n-type GaAs which had a high carrier concentration (density).

Selective ion implantation into the wafer with the multi-layer structure was executed to form a high-resistivity layer 7 on the substrate 1. Unnecessary portions of the emitter layer 5 and the emitter cap layer 6 were removed to form an emitter mesa including an emitter region 5A and an emitter cap region 6A as shown in FIG. 3(b). As a result of this removing process, the area of the base layer 4 which extended outward of the emitter region 5A was exposed. At the same time, an unnecessary upper portion of the high-resistivity layer 7 was removed so that a high-resistivity region 7A was formed as shown in FIG. 3(b). Then, a first insulating film 8 was formed on the whole of the upper surfaces on the wafer as a protective film for the transistor 100.

Unnecessary portions of the first insulting film 8 were removed as shown in FIG. 3(c). At the same time, unnecessary portions of the collector layer 3 and the base layer 4 were removed so that a collector region 3A and a base region 4A were formed. As a result of these removing processes, the emitter cap region 6A and the extrinsic area of the base region 4A were exposed. In addition, the area of the collector contact layer 2 which extended outward of the collector region 3A was exposed. An emitter electrode 9 was formed on the emitter cap region 6A as shown in FIG. 3(c). A base electrode 10 was formed on the extrinsic area of the base region 4A. In addition, a collector electrode 11 was formed on the area of the collector contact layer 2 which extended outward of the collector region 3A.

Then, the whole of the upper surfaces on the wafer was coated with a second insulting film 12 as shown in FIG. 3(d). After the formation of the second insulating film 12, the wafer was provided with contact holes for accommodating electrical leads to the emitter electrode 9, the base electrode 10, and the collector electrode 11. Single-layer metal wiring lines 13B, 13C, and 13E extending into the contact holes were formed as shown in FIG. 3(d). The single-layer metal wiring line 13E extended outward into an extension constituting one of the opposed electrodes of the capacitor 102.

Then, the whole of the upper surfaces on the wafer was coated with a third insulting film 14 as shown in FIG. 3(e). A portion of the third insulting film 14 constituted the dielectric film (insulating film) which was sandwiched between the opposed electrodes of the capacitor 102. After the formation of the third insulating film 14, the wafer was provided with contact holes for accommodating electrical leads. Two-layer metal wiring lines 15B, 15C, and 15E extending into the contact holes were formed as shown in FIG. 3(e). At the same time, a two-layer metal wiring electrode 15a constituting the other of the opposed electrodes of the capacitor 102 was formed on an area of the third insulating film 14 extending directly above the extension of the single-layer metal wiring line 13E. In this way, the semiconductor device was completed.

In the background-art semiconductor device of FIG. 3(e), the capacitor 102 has only two opposed electrodes. Thus, the area occupied by the capacitor 102 tends to be large for attaining a sufficient capacitance.

Figure 1A:
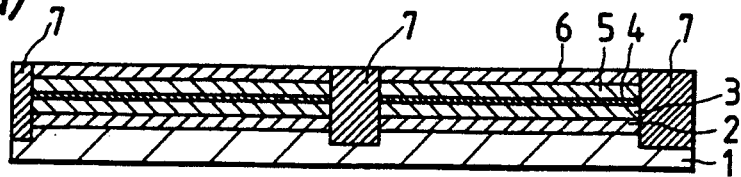
FIGS. 1(a) to 1(e) are sectional views of a semiconductor wafer in different states which occur during the fabrication of a semiconductor device according to a first embodiment of this invention.
Figure 1B:
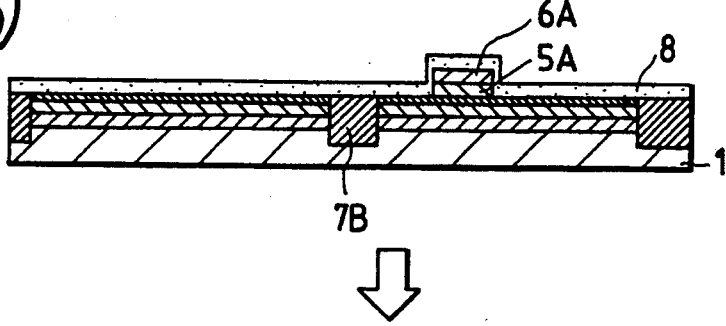

Embodiments of this invention will be described hereinafter. FIG. 1(e) shows a semiconductor device or integrated circuit according to a first embodiment of this invention which includes a heterojunction bipolar transistor 100 and a capacitor 104. The transistor 100 is of the emitter-up type.

As shown in FIG. 1(e), the semiconductor device of the first embodiment includes a substrate 1. A collector contact layer 2 is formed on a given area of the substrate 1. A collector region 3A and a base region 4A of the transistor 100 are sequentially formed on a given area of the collector contact layer 2. An emitter region 5A and an emitter cap region 6A of the transistor 100 are sequentially superposed on an intrinsic area of the base region 4A. The emitter region 5A is made of material which has a forbidden band gap (a forbidden band width) wider than that of the base region 4A.

A collector electrode 11 made of conductive material such as metal is formed on an area of the collector contact layer 2 which extends outside the collector region 3A. A single-layer metal wiring line 13C extends between the collector electrode 11 and a two-layer metal wiring line 15C. The collector region 3A is electrically connected to the two-layer metal wiring line 15C via the collector contact layer 2, the collector electrode 11, and the single-layer metal wiring line 13C.

A base electrode 10 is formed on an extrinsic area of the base region 4A. A single-layer metal wiring line 13B extends between the base electrode 10 and a two-layer metal wiring line 15B. The base region 4A is electrically connected to the two-layer metal wiring line 15B via the base electrode 10 and the single-layer metal wiring line 13B.

An emitter electrode 9 is formed on the emitter cap region 6A. A single-layer metal wiring line 13E extends between the emitter electrode 9 and a two-layer metal wiring line 15E. The emitter region 5A is electrically connected to the two-layer metal wiring line 15E via the emitter cap region 6A, the emitter electrode 9, and the single-layer metal wiring line 13E.

A high-resistivity region 7B is formed on an area of the substrate 1 which extends outward of the transistor 100. The high-resistivity region 7B isolates the transistor 100 from neighboring transistors and elements.

The capacitor 104 is formed on an area of the substrate 1 which extends outward of the transistor 100. The capacitor 104 is electrically connected to the emitter of the transistor 100. The capacitor 104 is of the multi-layer type. Specifically, the capacitor 104 includes three parallel electrodes and insulating films 12 and 14 extending therebetween. The three capacitor electrodes are upper, intermediate, and lower electrodes respectively. The upper electrode of the capacitor 104 is formed by a two-layer metal wiring electrode 15a. The intermediate electrode of the capacitor 104 is formed by an extension of the single-layer wiring line 13E which leads from the emitter electrode 9 of the transistor 100. The lower electrode of the capacitor 104 is formed by a metal electrode 11a. As will be made clear later, the lower capacitor electrode 11a and the collector electrode 11 are made of same material or metal, and are simultaneously formed in a common step or steps of fabrication of the semiconductor device. In addition, the upper capacitor electrode 15a and the two-layer metal wiring lines 15B, 15C, and 15E are made of same material, and are simultaneously formed in a common step or steps of fabrication of the semiconductor device.

Upper surfaces of the lower capacitor electrode 11a and the collector electrode 11 horizontally align with the upper surface of the base region 4A. In other words, the upper surfaces of the lower capacitor electrode 11a and the collector electrode 11 are in a height position approximately equal to a height position of the upper surface of the base region 4A. The insulating film 12 which extends between the lower capacitor electrode 11a and the intermediate capacitor electrode 13E insulates the electrodes 11a and 13E from each other. The insulating film 14 which extends between the intermediate capacitor electrode 13E and the upper capacitor electrode 15a insulates the electrodes 13E and 15a from each other. A single-layer metal wiring line 13F extends between the lower capacitor electrode 11a and the upper capacitor electrode 15a. The lower capacitor electrode 11a and the upper capacitor electrode 15a are electrically connected to each other via the single-layer metal wiring line 13F. As will be made clear later, the single-layer metal wiring lines 13B, 13C, 13E, and 13F are made of same material, and are simultaneously formed in a common step or steps of fabrication of the semiconductor device.

As previously described, the capacitor 104 is of the multi-layer type. Thus, the area occupied by the capacitor 104 which is necessary to attain a given capacitance is smaller than the area occupied by the capacitor 102 in the background-art semiconductor device of FIG. 3(e).

The semiconductor device of the first embodiment was fabricated as follows. As shown in FIG. 1(a), a semi-insulating substrate or wafer 1 made of GaAs was prepared, and a multi-layer structure was formed on the substrate 1. The multi-layer structure had a collector contact layer 2, a collector layer 3, a base layer 4, an emitter layer 5, and an emitter cap layer 6. The collector contact layer 2 was made of n-type GaAs which had a high carrier concentration (density). The collector layer 3 was made of n-type GaAs. The base layer 4 was made of p-type GaAs which had a high carrier concentration (density). The emitter layer 5 was made of N-type $Al_{0.3}Ga_{0.7}As$. The emitter cap layer 6 was made of n-type GaAs which had a high carrier concentration (density).

Selective ion implantation into the wafer with the multi-layer structure was executed to form a high-resistivity layer 7 on the substrate 1. Unnecessary portions of the emitter layer 5 and the emitter cap layer 6 were removed to form an emitter mesa including an emitter region 5A and an emitter cap region 6A as shown in FIG. 1(b). As a result of this removing process, the area of the base layer 4 which extended outward of the emitter region 5A was exposed. At the same time, an unnecessary upper portion of the high-resistivity layer 7 was removed so that a high-resistivity region 7B was formed as shown in FIG. 1(b). Then, a first insulating film 8 was formed on the whole of the upper surfaces on the wafer as a protective film for the transistor 100.

Figure 1C:
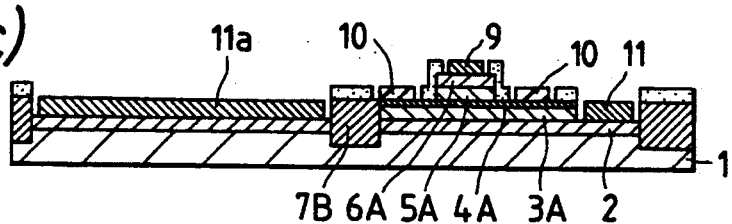

Unnecessary portions of the first insulting film 8 were removed as shown in FIG. 1(c). At the same time, unnecessary portions of the collector layer 3 and the base layer 4 were removed so that a collector region 3A and a base region 4A were formed. As a result of these removing processes, the emitter cap region 6A and the extrinsic area of the base region 4A were exposed. In addition, the areas of the collector contact layer 2 which extended outward of the collector region 3A and the high-resistivity region 7B were exposed. An emitter electrode 9 was formed on the emitter cap region 6A as shown in FIG. 1(c). A base electrode 10 was formed on the extrinsic area of the base region 4A. In addition, a collector electrode 11 and a lower capacitor electrode 11a were simultaneously formed on the areas of the collector contact layer 2 which extended outward of the collector region 3A and the high-resistivity region 7B. The collector electrode 11 and the lower capacitor electrode 11a were made of same conductive material (for example, metal).

Figure 1D:
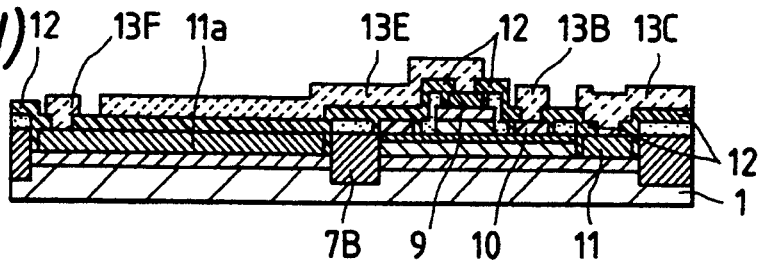
Figure 1E:
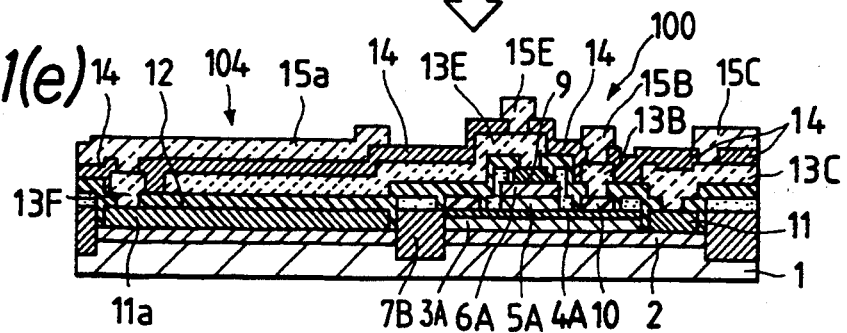

Then, the whole of the upper surfaces on the wafer was coated with a second insulting film 12 as shown in FIG. 1(d). Thus, the lower capacitor electrode 11a was covered with the second insulting film 12. After the formation of the second insulating film 12, the wafer was provided with contact holes for accommodating electrical leads to the emitter electrode 9, the base electrode 10, the collector electrode 11, and the lower capacitor electrode 11a. Single-layer metal wiring lines 13B, 13C, 13E, and 13F extending into the contact holes were simultaneously formed as shown in FIG. 1(d). The single-layer metal wiring lines 13B, 13C, 13E, and 13F were made of same material. The single-layer metal wiring line 13E extended outward into an extension which constituted the intermediate capacitor electrode and which lay on the second insulating film 12. A portion of the second insulting film 12 constituted the first dielectric film (insulating film) which was sandwiched between the lower capacitor electrode 11a and the intermediate capacitor electrode 13E of the capacitor 104.

Then, the whole of the upper surfaces on the wafer was coated with a third insulting film 14 as shown in FIG. 1(e). Thus, the intermediate capacitor electrode 13E was covered with the third insulating film 14. After the formation of the third insulating film 14, the wafer was provided with contact holes for accommodating electrical leads. Two-layer metal wiring lines 15B, 15C, and 15D extending into the contact holes were formed as shown in FIG. 1(e). At the same time, a two-layer metal wiring electrode 15a constituting the upper capacitor electrode was formed on an area of the third insulating film 14 extending directly above the extension of the single-layer metal wiring line 13E (that is, the intermediate capacitor electrode). The two-layer metal wiring electrode 15a extended into the contact hole and reached the single-layer metal wiring line 13F. The two-layer metal wiring electrode 15a and the two-layer metal wiring lines 15B, 15C, and 15D were made of same material. A portion of the third insulting film 14 constituted the second dielectric film (insulating film) which was sandwiched between the intermediate capacitor electrode 13E and the upper capacitor electrode 15a of the capacitor 104. In this way, the semiconductor device of the first embodiment was completed.

Figure 2A:
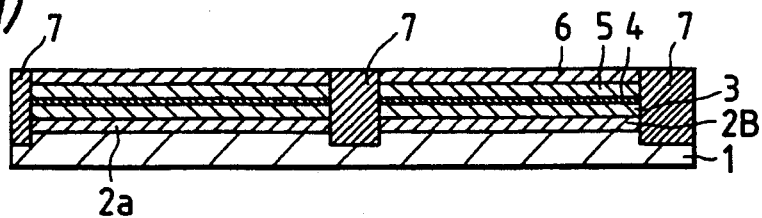
FIGS. 2(a) to 2(e) are sectional views of a semiconductor wafer in different states which occur during the fabrication of a semiconductor device according to a second embodiment of this invention.
Figure 2B:
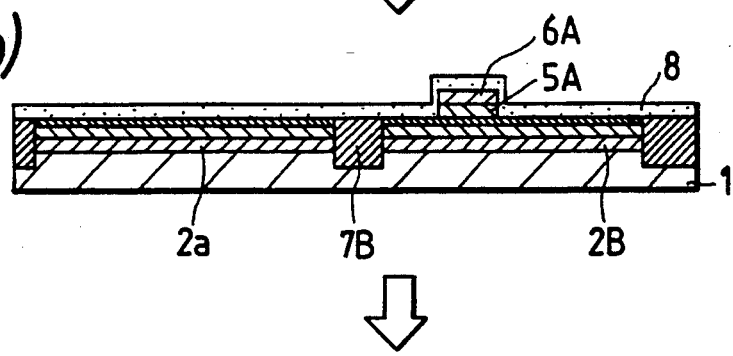
Figure 2C:
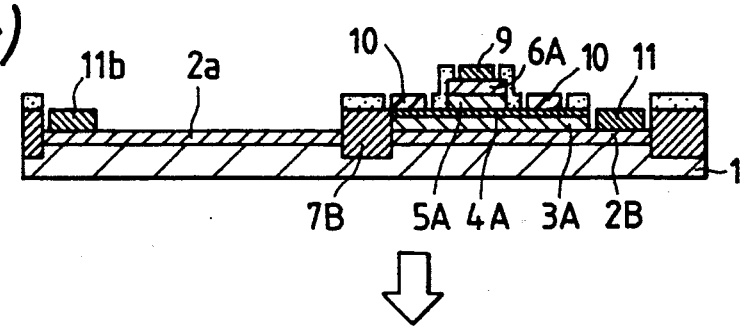
Figure 2D:
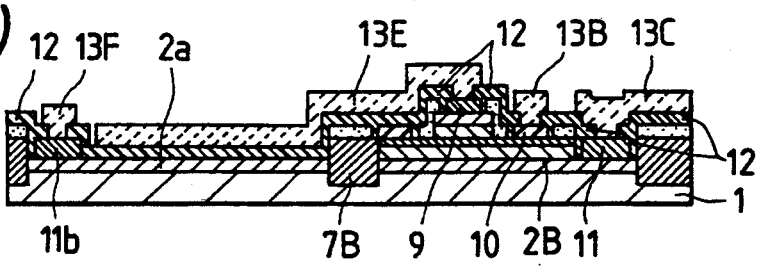
Figure 2E:
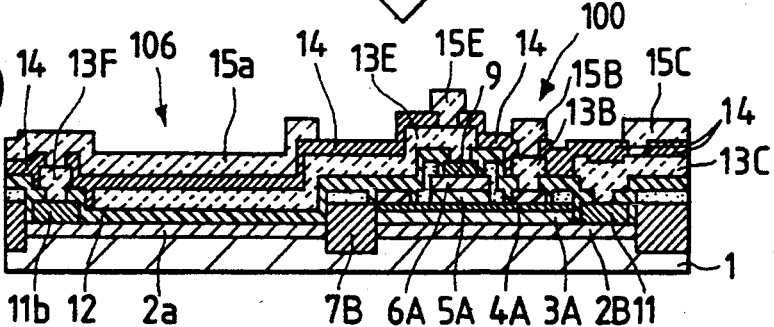

FIG. 2(e) shows a semiconductor device or integrated circuit according to a second embodiment of this invention which includes a heterojunction bipolar transistor 100 and a capacitor 106. The transistor 100 is of the emitter-up type.

As shown in FIG. 2(e), the semiconductor device of the second embodiment includes a substrate 1. A collector contact layer 2B is formed on a given area of the substrate 1. A collector region 3A and a base region 4A of the transistor 100 are sequentially formed on a given area of the collector contact layer 2B. An emitter region 5A and an emitter cap region 6A of the transistor 100 are sequentially superposed on an intrinsic area of the base region 4A. The emitter region 5A is made of material which has a forbidden band gap (a forbidden band width) wider than that of the base region 4A.

A collector electrode 11 is formed on an area of the collector contact layer 2B which extends outside the collector region 3A. A single-layer metal wiring line 13C extends between the collector electrode 11 and a two-layer metal wiring line 15C. The collector region 3A is electrically connected to the two-layer metal wiring line 15C via the collector contact layer 2, the collector electrode 11, and the single-layer metal wiring line 13C.

A base electrode 10 is formed on an extrinsic area of the base region 4A. A single-layer metal wiring line 13B extends between the base electrode 10 and a two-layer metal wiring line 15B. The base region 4A is electrically connected to the two-layer metal wiring line 15B via the base electrode 10 and the single-layer metal wiring line 13B.

An emitter electrode 9 is formed on the emitter cap region 6A. A single-layer metal wiring line 13E extends between the emitter electrode 9 and a two-layer metal wiring line 15E. The emitter region 5A is electrically connected to the two-layer metal wiring line 15E via the emitter cap region 6A, the emitter electrode 9, and the single-layer metal wiring line 13E.

A high-resistivity region 7B is formed on an area of the substrate 1 which extends outward of the transistor 100. The high-resistivity region 7B isolates the transistor 100 from neighboring transistors and elements.

The capacitor 106 is formed on an area of the substrate 1 which extends outward of the transistor 100. The capacitor 106 is electrically connected to the emitter of the transistor 100. The capacitor 106 is of the multi-layer type. Specifically, the capacitor 106 includes three parallel electrodes and insulating films 12 and 14 extending therebetween. The three capacitor electrodes are upper, intermediate, and lower electrodes respectively. The upper electrode of the capacitor 106 is formed by a two-layer metal wiring electrode 15a. The intermediate electrode of the capacitor 106 is formed by an extension of the single-layer wiring line 13E which electrically leads from the emitter electrode 9 of the transistor 100. The lower electrode of the capacitor 106 is formed by a conductive layer 2a. As will be made clear later, the lower capacitor electrode 2a and the collector contact layer 2B are made of same material, and are simultaneously formed in a common step or steps of fabrication of the semiconductor device. The lower capacitor electrode 2a and the collector contact layer 2B originate from a same conductive layer. The original conductive layer is separated by the high-resistivity region 7B into the lower capacitor electrode 2a and the collector contact layer 2B. The upper capacitor electrode 15a and the two-layer metal wiring lines 15B, 15C, and 15E are made of same material, and are simultaneously formed in a common step or steps of fabrication of the semiconductor device.

The insulating film 12 which extends between the lower capacitor electrode 2a and the intermediate capacitor electrode 13E insulates the electrodes 2a and 13E from each other. The insulating film 14 which extends between the intermediate capacitor electrode 13E and the upper capacitor electrode 15a insulates the electrodes 13E and 15a from each other. A conductive region 11b is formed on an edge of the lower capacitor electrode 2a. A single-layer metal wiring line 13F extends between the conductive region 11b and the upper capacitor electrode 15a. The lower capacitor electrode 2a and the upper capacitor electrode 15a are electrically connected to each other via the conductive region 11b and the single-layer metal wiring line 13F. As will be made clear later, the conductive region 11b and the collector electrode 11 are made of same material or metal, and are simultaneously formed in a common step or steps of fabrication of the semiconductor device.

As previously described, the capacitor 106 is of the multi-layer type. Thus, the area occupied by the capacitor 106 which is necessary to attain a given capacitance is smaller than the area occupied by the capacitor 102 in the background-art semiconductor device of FIG. 3(e).

The semiconductor device of the second embodiment was fabricated as follows. As shown in FIG. 2(a), a semi-insulating substrate or wafer 1 made of GaAs was prepared, and a multi-layer structure was formed on the substrate 1. The multi-layer structure had a conductive layer (which will form a collector contact layer 2B and a lower capacitor electrode 2a), a collector layer 3, a base layer 4, an emitter layer 5, and an emitter cap layer 6. The conductive layer to form a collector contact layer 2B and a lower capacitor electrode 2a was made of n-type GaAs which had a high carrier concentration (density). The collector layer 3 was made of n-type GaAs. The base layer 4 was made of p-type GaAs which had a high carrier concentration (density). The emitter layer 5 was made of N-type $Al_{0.3}Ga_{0.7}As$. The emitter cap layer 6 was made of n-type GaAs which had a high carrier concentration (density).

Selective ion implantation into the wafer with the multi-layer structure was executed to form a high-resistivity layer 7 on the substrate 1 as shown in FIG. 2(a). The high-resistivity layer 7 divided the conductive layer into a collector contact layer 2B and a lower capacitor electrode 2a. Unnecessary portions of the emitter layer 5 and the emitter cap layer 6 were removed to form an emitter mesa including an emitter region 5A and an emitter cap region 6A as shown in FIG. 2(b). As a result of this removing process, the area of the base layer 4 which extended outward of the emitter region 5A was exposed. At the same time, an unnecessary upper portion of the high-resistivity layer 7 was removed so that a high-resistivity region 7B was formed as shown in FIG. 2(b). Then, a first insulating film 8 was formed on the whole of the upper surfaces on the wafer as a protective film for the transistor 100.

Unnecessary portions of the first insulting film 8 were removed as shown in FIG. 2(c). At the same time, unnecessary portions of the collector layer 3 and the base layer 4 were removed so that a collector region 3A and a base region 4A were formed. As a result of these removing processes, the emitter cap region 6A and the extrinsic area of the base region 4A were exposed. In addition, the area of the collector contact layer 2B which extended outward of the collector region 3A was exposed. Furthermore, the lower capacitor electrode 2a was exposed. An emitter electrode 9 was formed on the emitter cap region 6A as shown in FIG. 2(c). A base electrode 10 was formed on the extrinsic area of the base region 4A. In addition, a collector electrode 11 and a conductive region 11b were simultaneously formed on the exposed areas of the collector contact layer 2B and the lower capacitor electrode 2a respectively. The collector electrode 11 and the conductive region 11b were made of same conductive material or metal. The conductive region 11b extended directly above an edge of the lower capacitor electrode 2a.

Then, the whole of the upper surfaces on the wafer was coated with a second insulting film 12 as shown in FIG. 2(d). Thus, the lower capacitor electrode 2a was covered with the second insulting film 12. After the formation of the second insulating film 12, the wafer was provided with contact holes for accommodating electrical leads to the emitter electrode 9, the base electrode 10, the collector electrode 11, and the contact region 11b. Single-layer metal wiring lines 13B, 13C, 13E, and 13F extending into the contact holes were simultaneously formed as shown in FIG. 2(d). The single-layer metal wiring lines 13B, 13C, 13E, and 13F were made of same material. The single-layer metal wiring line 13E extended outward into an extension which constituted the intermediate capacitor electrode and which lay on the second insulating film 12. A portion of the second insulting film 12 constituted the first dielectric film (insulating film) which was sandwiched between the lower capacitor electrode 2a and the intermediate capacitor electrode 13E of the capacitor 106.

Then, the whole of the upper surfaces on the wafer was coated with a third insulting film 14 as shown in FIG. 2(e). Thus, the intermediate capacitor electrode 13E was covered with the third insulating film 14. After the formation of the third insulating film 14, the wafer was provided with contact holes for accommodating electrical leads. Two-layer metal wiring lines 15B, 15C, and 15D extending into the contact holes were formed as shown in FIG. 2(e). At the same time, a two-layer metal wiring electrode 15a constituting the upper capacitor electrode was formed on an area of the third insulating film 14 extending directly above the extension of the single-layer metal wiring line 13E (that is, the intermediate capacitor electrode). The two-layer metal wiring electrode 15a extended into the contact hole and reached the single-layer metal wiring line 13F. The two-layer metal wiring electrode 15a and the two-layer metal wiring lines 15B, 15C, and 15D were made of same material. A portion of the third insulting film 14 constituted the second dielectric film (insulating film) which was sandwiched between the intermediate capacitor electrode 13E and the upper capacitor electrode 15a of the capacitor 106. In this way, the semiconductor device of the second embodiment was completed.

In the previously-mentioned embodiments of this invention, the transistor 100 may be of the collector-up type. In these cases, a lower capacitor electrode and an emitter electrode or an emitter contact layer are made of same material, and are simultaneously formed.

In the previously-mentioned embodiments of this invention, provided that the emitter region 5A is made of material which has a forbidden band gap (a forbidden band width) wider than that of the base region 4A, the materials for the base region 4A and the emitter region 5A may be different from GaAs and $Al_{0.3}Ga_{0.7}As$ respectively.

What is claimed is:

1. A method of fabricating a semiconductor device, comprising the steps of:
    forming a multi-layer structure on a substrate, the multi-layer structure including a collector layer, a base layer, and an emitter layer, the emitter layer being made of material having a forbidden band gap wider than a forbidden band gap of material for the base layer;
    exposing a portion of the base layer;
    simultaneously forming a collector electrode and a first capacitor electrode, the collector electrode being electrically connected to the collector layer and having an upper surface in a height position approximately equal to a height position of a surface of the exposed portion of the base layer; and
    forming wiring lines which include a second capacitor electrode opposed to the first capacitor electrode.

2. The method of claim 1, wherein said step of forming wiring-lines comprises simultaneously forming a first wiring line, electrically connected to the emitter layer and including the second capacitor electrode, and a second wiring line, including a capacitor-electrode connecting line, and
    further comprising the step of simultaneously forming a third wiring line, including a third capacitor electrode opposed to the second capacitor electrode and electrically connected to the first capacitor electrode via the capacitor-electrode connecting line, and a fourth wiring line, electrically connected to the first wiring line.

3. A method of fabricating a semiconductor device, comprising the steps of:

forming a multi-layer structure on a substrate, the multi-layer structure including a collector layer, a base layer, an emitter layer, and a collector contact layer, the emitter layer being made of material having a forbidden band gap wider than a forbidden band gap of material for the base layer;

forming a first capacitor electrode from a portion of the collector contact layer; and forming wiring lines which include a second capacitor electrode opposed to the first capacitor electrode.

4. The method of claim 3, wherein said step of forming wiring-lines comprises simultaneously forming a first wiring line, electrically connected to the emitter layer and including the second capacitor electrode, and a second wiring line, including a capacitor-electrode connecting line, and further comprising the step of simultaneously forming a third wiring line, including a third capacitor electrode opposed to the second capacitor electrode and electrically connected to the first capacitor electrode via the capacitor-electrode connecting line, and a fourth wiring line, electrically connected to the first wiring line.

5. A method of fabricating a semiconductor device, comprising the steps of:

forming a heterojunction bipolar transistor including a region;

forming a multi-layer capacitor of a laminated structure including three electrodes which contain a capacitor electrode made of a material same as a material for the region of the transistor;

simultaneously forming the region of the transistor and the capacitor electrode; and electrically connecting the transistor and the capacitor.

6. A method of fabricating a semiconductor device, comprising the steps of:

forming a multi-layer structure on a substrate, the multi-layer structure including a collector layer, a base layer, and an emitter layer, the emitter layer being made of material having a forbidden band gap wider than a forbidden band gap of material for the base layer;

exposing a portion of the base layer;

simultaneously forming an emitter electrode and a first capacitor electrode, the emitter electrode being electrically connected to the emitter layer and having an upper surface in a height position approximately equal to a height position of a surface of the exposed portion of the base layer; and forming wiring lines which include a second capacitor electrode opposed to the first capacitor electrode.

7. A method of fabricating a semiconductor device, comprising the steps of:

forming a multi-layer structure on a substrate, the multi-layer structure including a collector layer, a base layer, an emitter layer, and an emitter contact layer, the emitter layer being made of material having a forbidden band gap wider than a forbidden band gap of material for the base layer;

forming a first capacitor electrode from a portion of the emitter contact layer; and forming wiring lines which include a second capacitor electrode opposed to the first capacitor electrode.

* * * * *